United States Patent [19]

Matsuda

[11] 4,198,263

[45] Apr. 15, 1980

[54] MASK FOR SOFT X-RAYS AND METHOD OF MANUFACTURE

[75] Inventor: Takashi Matsuda, Kasugai, Japan

[73] Assignee: Tokyo Shibaura Electric Co., Ltd., Kawasaki, Japan

[21] Appl. No.: 782,379

[22] Filed: Mar. 29, 1977

[30] Foreign Application Priority Data

Mar. 30, 1976 [JP] Japan ................................. 51/34832
Mar. 30, 1976 [JP] Japan ................................. 51/34833

[51] Int. Cl.$^2$ ........................................ H01L 21/306
[52] U.S. Cl. ................................ 156/639; 156/659; 156/659.1; 428/195; 430/966; 430/5
[58] Field of Search ............... 156/628, 662, 657, 656, 156/655, 659, 639; 96/38.6; 428/195

[56] References Cited

U.S. PATENT DOCUMENTS

| | | | |
|---|---|---|---|
| 3,721,593 | 3/1973 | Hays et al. | 156/628 |
| 3,742,230 | 6/1973 | Spears | 96/38.4 |
| 3,767,494 | 10/1973 | Muraoka et al. | 156/662 |
| 3,853,650 | 12/1974 | Hartlaub | 156/655 |
| 3,941,629 | 3/1976 | Kaffe | 156/657 |
| 3,959,037 | 5/1976 | Gutierrez et al. | 156/656 |
| 3,959,038 | 5/1976 | Gutierrez et al. | 156/656 |
| 3,959,045 | 5/1976 | Antypas | 156/656 |

*Primary Examiner*—Marion E. McCamish
*Assistant Examiner*—E. Rollins Buffalow
*Attorney, Agent, or Firm*—Finnegan, Henderson, Farabow, Garrett & Dunner

[57] ABSTRACT

A mask for soft X-rays comprising a silicon film which permits the penetration of soft X-rays, a soft X-ray mask pattern deposited on one surface of the silicon film, and a supporting member composed of silicon layers and disposed marginally on the other surface of the silicon film, the silicon film being formed on the supporting member by epitaxial growth or impurity diffusion.

A method of making a mask for soft X-rays which comprises the steps of successively forming a first and a second layer on a silicon substrate by epitaxial growth or the like, the first and second layers having different impurity concentrations; forming a soft X-ray mask pattern on the second layer; etching the silicon substrate selectively to remove the silicon substrate except its marginal region; and etching the first layer.

13 Claims, 10 Drawing Figures

MASK FOR SOFT X-RAYS AND METHOD OF MANUFACTURE

BACKGROUND OF INVENTION

This invention relates to the construction and manufacture of masks for soft X-rays. More particularly, it relates to the construction and manufacture of masks for exposure to soft X-rays which have a large exposure area and eliminate the possibility of any "dislocation of mask".

Conventionally, the photoengraving technique has been employed in the fabrication of semiconductor intergrated-circuit devices. However, the resolving power of the photoengraving technique is limited by the effects of interference and diffraction which are directly related to the wavelength of light used for that purpose, so that the minimum line width which can be reproduced stably is of the order of about 2 microns ($\mu$). Accordingly, from a demand for miniaturization and large-scale integration of integrated-circuit devices, the techniques of exposure to scanning electron beams and to soft X-rays instead of light have been developed. However, the former technique requires much time because the object must be continuously scanned with an electrol beam. Therefore, it is useful for the manufacture of master masks but, from an economical point of view, not convenient for the purpose of processing semiconductor substrates directly. On the other hand, the latter technique, commonly called the "X-ray transfer technique", in which soft X-rays having a wavelength of several angstroms (Å) is used instead of light, is inexpensive and economical as compared with the above-mentioned scanning electrol beams techinique. A mask for soft X-rays comprises a masking material and a film which supports the masking material and permits the penetration of soft X-rays. The thickness of the masking material is limited by the method used for patterning it. For example, the thickness is up to about $0.5\mu$ when the minimum line width is $1\mu$. Correspondingly, the thickness of the film which permits the penetration of soft X-rays is at most about $10\mu$, though it depends on the wavelength of soft X-rays and the material of the film.

For the film which permits the penetration of soft X-rays, films of silicon and of organic material have been used in the past. Films of organic material facilitate the manufacture of masks having a large exposure area, but have the fatal disadvantage f producing a "dislocation of mask" due to the difference between the thermal expansion coefficients of the film and the semiconductor substrate or silicon. Thus, the accuracy of masks will not be maintained unless precise temperature control is achieved both during the transfer process and during the mask manufacturing process.

In the case of silicon films, the above-mentioned problem of "dislocation of mask" does not arise because they are made of the same material as that of the substrate. They are readily used to make masks having a very small exposure area, but the manufacture of masks having a large exposure area has heretofore been considered to be difficult because they are brittle as compared with films of organic material. In order to overcome this difficulty, there has been proposed the method in which, as shown in FIG. 1, a mask pattern 2 is formed on one surface of a silicon substrate 1 having a thickness of about $10\mu$ and a supporting member 3 is bonded to the other surface by means of an adhesive 4. Although masks having a relatively large exposure area can be obtained according to this method, the disadvantage of tending to produce a warpage or distortion of mask due to thermal expansion or shrinkage of the adhesive 4 makes this method of little practical value.

SUMMARY OF THE INVENTION

This invention has been accomplished in view of the above-described circumstances. Therefore, it is the main object of this invention to provide a mask or exposure to soft X-rays which has a large exposure area and eliminates the possibility of any "dislocation of mask" as well as to provide a method of making such a mask.

In accordance with this invention, there is provided a mask for soft X-rays comprising a silicon film having a thickness which substantially permits the penetration of soft X-rays, a mask pattern deposited on one surface of said silicon film, and a supporting member composed of two different silicon layers disposed marginally on the other surface of said silicon film, characterized in that said supporting member consists of a silicon substrate corresponding to one of said two silicon layers and an intermediate layer formed thereon by epitaxial growth or impurity diffusion, and said silicon film is formed on said intermediate layer by epitaxial growth or impurity diffusion.

Further, there is also provided a method of making a mask for soft X-rays which comprises the steps of successively forming a first and a second layer on one surface of a silicon substrate by epitaxial growth or impurity diffusion; forming a mask pattern on the top surface of said second layer, said mask pattern consisting a gold layer which substantially prevents the penetration of soft X-rays; removing said silicon substrate except its marginal region by using an etching solution which etches said silicon substrate selectively; and removing said first layer except its marginal region by using an etching solution which etches said first layer selectively.

DETAILED DESCRIPTION OF THE INVENTION

Figure 1:
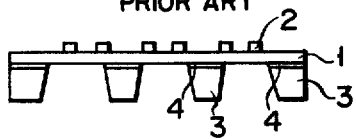
FIG. 1 is a sectional side view of one form of the prior art mask for soft X-rays.

One important feature of this invention is that, when the mask substrate which permits the penetration of soft X-rays comprises silicon and the mask has a large exposure surface, the reinforcement used for increasing the strength of the mask consists of a supporting member of silicon crystallographically integral with the silicon of the mask substrate, instead of a conventional supporting member bonded to the mask substrate by means of an adhesive. More specifically, a relatively thick silicon substrate is provided, a silicon layer which will finally be a mask substrate is formed thereon by epitaxial growth or impurtiy diffusion, and a predetermined region of the silicon substrate is then etched away, so that both are firmly united together without use of an adhesive as was usual in the prior art.

Another feature of this invetion is that, when a silicon layer which will finally be a mask substrate is formed on a silicon substrate as described above and the silicon susbstrate is then etched away except its marginal region which will finally be a supporting member, the etching is not carried out after the silicon layer or mask substrate is formed directly on the silicon substrate, but after an intermediate silicon layer substantially thinner than the silicon substrate is interposed between the silicon substrate and the silicon layer (or mask substrate). More specifically, a silicon substrate is provided, a first layer having an impurity concentration different from that of the silicon substrate is formed thereon by epitaxial growth or impurity diffusion to a thickness substantially less than that of the silicon substrate, and a second layer (which will finally be a mask substrate) having an impurity concentration different from that of the first layer is then formed thereon. Therefore, the silicon substrate is etched with an etching solution whose etching rate for the silicon substrate is sufficiently higher than that for the first layer, and the first layer is then etched with an etching solution whose etching rate for the first layer is sufficiently higher than that for the second layer, whereby the finally remaining second layer is used as the mask substrate. The reason why the etching is carried out in two steps is that the variation in thickness of the finally obtained mask is minimized whereby the strength of the mask is maintained and the variation in exposure of the object exposed therethrough to soft X-rays is lessened. Even though relatively wide variation in thickness of the first layer results from the first step of etching, this variation is canceled in the second step of etching because the first layer is sufficiently thinner than the silicon substrate. Thus, the variation in thickness of the second layer is significantly little when the etching is carried out in two steps.

Further features of this invention are that, when the first layer formed on the silicon substrate is etched, some suitable region of the first layer may be left as it is and utilized as part of the supporting member and that an additional supporting member may be formed on the top surface (or mask pattern-bearing surface) of the mask substrate so as to increase the strength of the mask.

Figure 2:
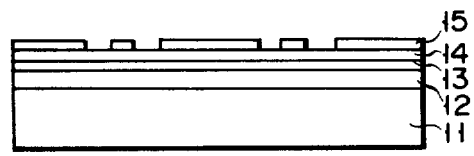
FIG. 2 through 7 are sectional side views of an improved mask for soft X-rays illustrating one form of the method of this invention.

The present invention is more fully described by reference to FIGS. 2 through 7. In FIG. 2, there is shown an n-type silicon substrate 11 having a thickness of, for example, several hundreds of microns and an impurity concentration of preferably not greater than $10^{18}$/CC. On the top surface of the silicon substrate 11, a first silicon layer (or intermediate layer) 12 is formed by epitaxial growth or impurity diffusion. This first silicon layer 12 has an impurity concentration of preferably not less than $2 \times 10^{19}$/CC and a thickness of, for example, from several microns to several tens of mircons. On the top surface of the first silicon layer 12, a second silicon layer 13 is further formed by epitaxial growth or impurity diffusion. This second silicon layer 13 has an impurity concentration of preferably not greater than $5 \times 10^{15}$/CC and such a thickness as to permit the penetration of soft X-rays, for example, from several microns to about 10 microns. On the top surface of the second silicon layer 13, a chrome layer 14 is deposited to a thickness of, for example, 150Å. This chrome layer 14 serves to facilitate the subsequent deposition of a soft X-ray mask such as a gold film. After the gold film is deposited, the chrome layer 14 may either be left as it is or be removed. On the top surface of the chrome layer 14, a resist pattern 15 is formed from polymethyl methacrylate or the like. This resist pattern 15 can be obtained by depositing a film of resist material such as polymethyl methacrylate and the like, exposing the film to scanning electron beams or soft X-rays, and then etching the film with a suitable solvent.

Figure 3:
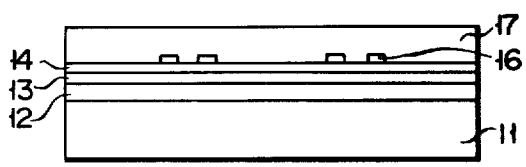

FIG. 3 shows the silicon assembly of FIG. 2 which has been processed by selectively plating a soft X-ray masking material such as gold 16 with the resist pattern 15 utilized as a mask, removing the resist pattern 15 with a suitable solvent, and then covering the processed surface with a protective coating 17 against etching solutions for silicon.

Figure 4:
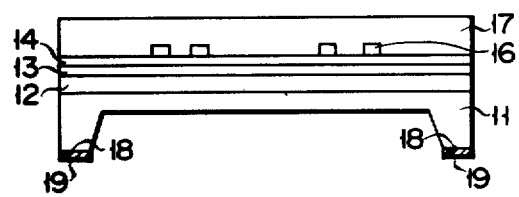
Figure 5:
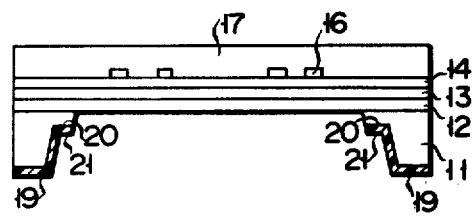

Then, as shown in FIG. 4, the bottom surface of the silicon substrate 11 except its marginal region 18 is etched with a silicon etching solution until the thickness of the silicon substrate 11 is reduced to, for example, about ⅓. Prior to this etching, the marginal region 18 of the bottom surface is covered beforehand with a protective coating 19 of wax or the like. Thereafter, as shown in FIG. 5, the marginal region 20 of the surface to be etched is covered with a protective coating 21 and the silicon substrate 11 is then etched with an etching solution having such selectivity that its etching rate for the silicon substrate 11 is significantly higher than that for the first silicon layer 12.

Figure 8:
FIG. 8 is a sectional side view, on an enlarged scale, of a portion of a mask for soft X-rays.

One of the reasons why the silicon substrate 11 is etched in two steps as described above is that, as shown in FIG. 8, the edge 22 of the surface being etched is subjected to greater stress and thereby etched at a higher rate than the other region thereof. If the silicon substrate 11 is etched in a single step, the edge 22 will undesirably be etched quite deep to give an excessively large difference in film thickness between the edge 22 and the other region. Another reason is that the efficiency of etching of the silicon substrate 11 is enhanced. Accordingly, as described above, the initial etching of the silicon substrate 11 is interrupted at a proper stage, the marginal region or edge 22 is covered with a protective coating 21, and then the silicon substrate 22 is etched again.

Figure 6:
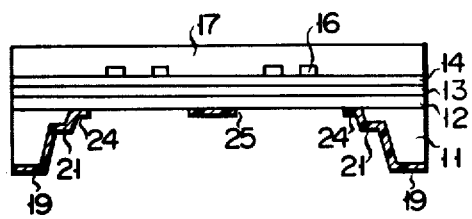
Figure 7:
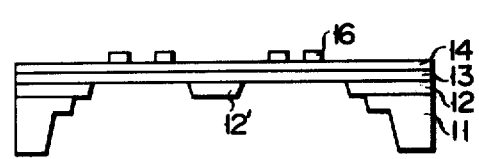

For similar reasons, the first silicon layer 12 is etched in such a manner as shown in FIG. 6. That is, the marginal region or edge of the surface to be etched is covered with a protective coating 24 and, if necessary, that region which will provide an additional supporting member for the second silicon layer 13 is also covered with a protective coating 25. Then, the first silicon layer 12 is etched with an etching rate for the first silicon layer 12 that is significantly higher than that for the second silicon layer 13. Finally, the protective coatings 17, 19, 21, 24, and 25 are removed to obtain a mask for exposure to soft X-rays as shown in FIG. 7.

In carrying out the treatment with an etching solution, the selectivity of the etching solution may be enhanced by both revolving and rotating the above-mentioned silicon assembly. This operation brings about agitation of the etching solution and uniform contact with the etched surface as well as quick removal of the reacted etching solution, thereby enhancing the selectivity of the etching solution.

In connection with FIG. 2, the arrangement has been described in which a silicon layer having a high impurity concentration is formed as the first silicon layer 12 and a silicon layer having a low impurity concentration is formed as the second silicon layer 13. However, this arrangement may be reversed. That is, it is also possible to form a silicon layer having a low impurity concentration as the first silicon layer 12 and a silicon layer having a high impurity concentration as the second silicon layer 13.

The composition of etching solutions having particularly good selectivity to specific impurity concentrations and the conditions for treatment with such etching solutions are well known, and seems to be easily determined by those skilled in the art. Therefore, concrete details are omitted herein.

Figure 9:
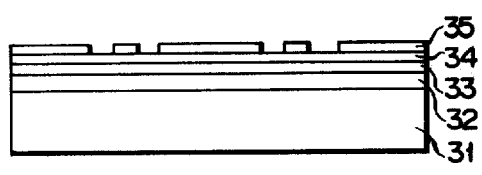
FIGS. 9 and 10 are sectional side views of an improved mask for soft X-rays illustrating a modified form of the method of this invention.
Figure 10:
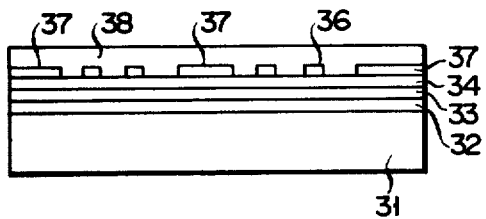

FIGS. 9 and 10 illustrate a modified form of the method of this invention in which an additional supporting member is formed on the top surface of the mask substrate. FIG. 9 shows an arrangement similar to that of FIG. 2. More specifically, there is shown an n-type silicon substrate 31 having a thickness of, for example, several hundreds of microns and an impurity concentration of preferably not greater than $10^{18}$/CC. On the top surface of this silicon substrate 31, a first silicon layer 32 having an impurity concentration of not less than $2 \times 10^{19}$/CC and a thickness of, for example, from several microns to several tens of microns is formed by epitaxial growth or impurity diffusion. On the top surface of this first silicon layer 32, a second silicon layer 33 having an impurity concentration of not greater than $5 \times 10^{15}$/CC and a thickness of, for example, from several microns to about 10 microns is formed in the same manner. Similar to the arrangement of FIG. 2, a chrome layer 34 is deposited on the top surface of the second silicon layer 33, and a resist pattern 35 is further formed thereon.

Utilizing the resist pattern 35 as a mask, a soft X-ray masking material 36 is selectively plated, the resist pattern 35 is removed with a suitable solvent, and a supporting member 37 is deposited on a suitable region of the processed surface. This supporting member comprises a material, such as a polyimide resin, which has a thermal expansion coefficient similar to that of silicon and is not appreciably affected by soft X-rays. Therefore, the processed surface is covered with a protective coating 38, and the silicon substrate 31 and the first silicon layer 32 are etched in the same manner as described in connection with FIGS. 4 through 7, whereby a mask for soft X-rays is obtained. In this arrangement, the supporting member 37 and the soft X-ray mask pattern 36 are disposed on an identical surface. It is advantageous, therefore, because the accuracy of the position where the supporting member is deposited can readily be expected.

The present invention is further illustrated by the following examples.

EXAMPLE 1

This example is based on the arrangement illustrated in FIGS. 2 through 7, and therefore described by reference to these figures. On one surface of an n-type silicon wafer 11 having a resistivity of 10Ω-cm and measuring 75 mm in diameter and 600μ in thickness, a first epitaxial layer 12 of 35μ thickness having a boron concentration of $1 \times 10^{20}$/CC at 1170° C. was formed by reducing trichlorosilane (SiHCl$_3$) with hydrogen. Then, a second epitaxial layer 13 of 3.8μ thickness having a boron concentration of $8 \times 10^{14}$/CC at 1000° C. was formed thereon by thermal decomposition of monosilane (SiH$_4$). Thereafter, a chrome layer 14 of 150 Å thickness was formed by vacuum deposition. This chrome layer was intended to facilitate the deposition of a subsequently plated gold layer. Then, a desired resist pattern 15 of 0.8μ thickness was formed by exposure to scanning electron rays. Utilizing this resist pattern 15 as a mask, a gold layer 16 of 0.5μ thickness was selectively plated and the resist pattern 15 was then removed.

Thereafter, as shown in FIG. 3, the surface processed as described above was covered with a protective coating 17 against etching solutions for silicon. Using a silicon etching solution having the composition (by volume)

$$HF:HNO_3 = 3:97 \qquad (1).$$

the exposed surface (or the surface opposite to that processed as described above) of the silicon wafer except its marginal region 18 of 5 mm width was etched until its thickness was reduced by 400μ. Then, as shown in FIG. 5, the marginal region 21 of 7 mm width was covered and the silicon wafer 11 was etched with an etching solution having the composition;

$$Ethylenediamine:Water:Pyrocatechol = 17\ cc:8\ cc:3\ g \qquad (2).$$

At the boron concentration ratio between the above-described silicon wafer 11 and first epitaxial layer 12, the selectivity of the etching solution having the composition (2) is represented by a ratio of 15:1. Then, a resist 25 in the shape of a lattice having a width of 400μ was deposited by the conventional photoetching technique, the marginal region of 9 mm width was covered with a protective coating 24, and the first epitaxial layer 12 was etched by a selective etching method using an etching solution having the composition;

$$HF:HNO_3:CH_3COOH = 1:3:8 \qquad (3).$$

According to this method, a positive electrode made of carbon and a negative one made of platinum was placed in the etching solution and hydrogen peroxide (H$_2$O$_2$) was added thereto in such an amount that the potential difference between both electrodes was held at a predetermined level of 40 mV. At the boron concentration ratio between the above-described first epitaxial layer 12 and second epitaxial layer 13, the selectivity of the etching solution having the composition (3) is represented by a ratio of 200:1. After the above-described etching of the first epitaxial layer 12, the second epitaxial layer 13 showed a surface roughness of 1000 Å. Its effect on the penetration of soft X-rays could be utterly neglected in consideration of the thickness, 3.8μ, of the layer 13. The silicon wafer 11 and the first epitaxial layer 12 were etched while the silicon wafer was being revolved at 40 rpm and rotated at 20 rpm. This was effective in securing the uniformity of surface. Especially when the first epitaxial layer 12 is etched selectively, the selectivity will be reduced to a ratio of 30:1 unless the silicon wafer is both rotated and revolved. On removal of the protective coatings 17, 19, 21, 24, and 25, a mask for exposure to soft X-rays as shown in FIG. 7 was obtained. In this mask, the remaining lattice-like region 12' of the first epitaxial layer 12 constituted a reinforcement.

EXAMPLE 2

In this example, the procedure of Example 1 was repeated except that the arrangement of silicon layers was altered. That is, on one surface of an arsenic (As)-doped silicon wafer 11 having a resistivity of 0.005μ-cm and measuring 75 mm in diameter and 600μ in thickness, a first epitaxial layer 12 of 35μ thickness having a boron concentration of $7 \times 10^{14}$/CC at 1170° C. was formed by reducing trichlorosilane (SiHCl$_3$) with hydrogen. Then, a second epitaxial layer 13 of 3.8μ thickness having a boron concentration of $1 \times 10^{20}$/CC at 1000° C. was formed thereon by thermal decomposition of monosilane (SiH$_4$). Thereafter, the silicon assembly was processed in the same manner as in Example 1. After the silicon wafer 11 and the first epitaxial layer 12 were etched with the same etching solutions as defined in Example 1, a mask for exposure to soft X-rays as shown in FIG. 7 was obtained.

EXAMPLE 3

This example is based on the arrangement illustrated in FIGS. 9 and 10, and therefore described by reference to these figures. An n-type silicon wafer 31 having a resistivity of 10Ω-cm and measuring 75 mm in diameter and 600μ in thickness was provided. On one surface of this silicon wafer 31, a first epitaxial layer 32 of 15μ thickness having a boron concentration of $9 \times 10^{19}$/CC at 1170° C. was formed by reducing silicon tetrachloride (SiCl$_4$) with hydrogen. Then, in order to make the concentration gradient as steep as possible because of the dependence of the subsequent selective etching process on the impurity concentration, a second epitaxial layer 33 of 3.8μ thickness having a boron concentration of $8 \times 10^{14}$/CC at 1000° C. was formed thereon by thermal decomposition of monosilane (SiH$_4$). Thereafter, a chrome layer 34 of 150Å thickness was formed by vacuum deposition. This chrome layer was intended to facilitate the deposition of a subsequently plated gold layer. Then, as shown in FIG. 9, a desired resist pattern 35 of 0.8μ thickness was formed by exposure to scanning electron beams.

Utilizing the resist pattern 35 as a mask, a gold layer 36 of 0.5μ thickness was selectively plated and the resist pattern 35 was then removed (as shown in FIG. 10). Then, a polyimide resin 37 was deposited to a thickness of 10μ and the processed surface was covered with a protective coating 38 against etching solutions for silicon. Thereafter, the silicon assembly was etched with the same etching solution as defined in Example 1 and processed in the same manner whereby a mask for soft X-rays was obtained.

In this example, the first epitaxial layers 32 exposed by etching the silicon wafer 31 showed a surface roughness of about 2μ. After etching the first epitaxial layer 32, however, the second epitaxial layer 33 showed a surface roughness of about 1000Å. Its effect on the penetration of soft X-rays could be utterly neglected in consideration of the thickness, 3.8μ, of the layer 33.

EXAMPLE 4

In this example, the procedure of Example 1 was repeated except that the formation of impurity layers 12 and 13 on the silicon wafer 11 was carried out by means of impurity diffusion instead of epitaxial growth as illustrated in FIG. 2. The same n-type silicon wafer 11 as described in the Example 1 was used as a substrate on which a boron silicate glass layer having a high concentration of boron was deposited and heated at a temperature of 1100° C. to obtain a first impurity layer 12, 20μ in thickness and an impurity concentration of $10^{20}$–$10^{14}$/CC.

After removing the boron silicate glass layer, a phospho-silicate glass layer was deposited on the first impurity layer 12 and heated at a temperature of 1100° C. to obtain a diffusion layer 13, 3 to 4μ in thickness and having an impurity concentration of $1 \times 10^{15}$/CC at the upper layer of the first impurity layer 12.

Thereafter, the silicon assembly was processed and etched in the same manner as in Example 1, and a mask for soft X-rays as shown in FIG. 7 was obtained.

The masks obtained in Examples 1, 2, 3 and 4 were used for the purpose of exposure to soft X-rays characteristic of aluminum having a wavelength of 8.34Å. As a result, exceptionally good patterns were produced.

What is claimed is:

1. A method for forming a mask for soft X-ray exposure, comprising the steps of:
    (a) forming a first silicon layer on a silicon substrate by epitaxial growth or impurity diffusion, the impurity concentration of said first layer being different than said substrate;
    (b) forming a second silicon layer on said first layer by epitaxial growth or impurity diffusion, the thickness of said second layer permitting penetration of soft X-rays and being less than said first layer and the impurity concentration of said second layer being different than said first layer;
    (c) forming a mask pattern impenetrable to soft X-rays on said second layer by depositing a film of resist material on said second layer, etching a pattern in said film, plating a soft X-ray masking material on said second layer and removing said resist material pattern;
    (d) removing said silicon substrate except for its marginal region with an etching solution having an etching rate for said substrate higher than for said first layer; and
    (e) removing said first layer except for its marginal region with an etching solution having an etching rate for said first layer higher than said second layer.

2. A method as claimed in claim 1 wherein a silicon wafer having an impurity concentration of not greater than $10^{18}$/CC is used as said silicon substrate, a silicon layer having an impurity concentration of not less than $2 \times 10^{19}$/CC is formed as said first layer, and a silicon layer having an impurity concentration of not greater than $5 \times 10^{15}$/CC is formed as said second layer.

3. A method as claimed in claim 1 wherein a silicon wafer having an impurity concentration of not greater than $10^{18}$/CC is employed as said silicon substrate, a silicon layer having an impurity concentration of not greater then $5 \times 10^{15}$/CC is formed as said first layer, and a silicon layer having an impurity concentration of not less than $2 \times 10^{19}$/CC is formed as said second layer.

4. A method as claimed in claim 1 further including the step of, subsequently to the formation of said mask pattern, depositing a supporting member on such a region of the mask pattern-bearing surface of said second layer as is not covered by said mask pattern.

5. A method as claimed in claim 1 wherein the selective etching of said silicon substrate is interrupted at an intermediate stage, the etched surface of said silicon substrate is covered with an etching-resistant protective coating to a width greater than that of said marginal region, and the selective etching of said silicon substrate is carried on again.

6. A method as claimed in claim 1 wherein the etching of said first layer is carried out after the marginal region of the exposed surface of said first layer has been covered with an etching-resistant protective coating.

7. A method as claimed in claim 1 wherein the etching of said first layer is carried out after the marginal region of the exposed surface of said first layer and such another region thereof as does not overlap said mask pattern have been covered with an etching-resistant protective coating.

8. A method as claimed in claim 1 wherein the selective etching of said silicon substrate is carried out after the mask pattern-bearing surface of said second layer has been covered with an etching-resistant protective coating.

9. A method as claimed in claim 1 wherein the step of forming said mask pattern includes the step of depositing a chrome layer on said second layer to a thickness which substantially permits the penetration of soft X-rays and then forming said resist material pattern and plating said soft X-ray masking material on said chrome layer.

10. The method as in claim 9 wherein said soft x-ray masking material is gold.

11. The method as in claim 1 wherein said soft X-ray masking material is gold.

12. A method as claimed in claim 1 wherein the etching of said silicon substrate is carried out while said silicon substrate is being both rotated and revolved.

13. A method as claimed in claim 1 wherein the etching of said first layer is carried out while said first layer being both rotated and revolved.

* * * * *